(12) United States Patent
Jurisch et al.

(10) Patent No.: US 9,181,633 B2
(45) Date of Patent: Nov. 10, 2015

(54) DEVICE AND PROCESS FOR HEATING III-V WAFERS, AND ANNEALED III-V SEMICONDUCTOR SINGLE CRYSTAL WAFER

(75) Inventors: Manfred Jurisch, Dresden (DE); Stefan Eichler, Dresden (DE); Thomas Bünger, Lüneburg (DE); Berndt Weinert, Freiberg (DE); Frank Börner, Dresden (DE)

(73) Assignee: FREIBERGER COMPOUND MATERIALS GMBH, Freiberg (DE)

( * ) Notice: Subject to any disclaimer, the term of this patent is extended or adjusted under 35 U.S.C. 154(b) by 964 days.

(21) Appl. No.: 12/251,754

(22) Filed: Oct. 15, 2008

(65) Prior Publication Data

US 2009/0104423 A1 Apr. 23, 2009

Related U.S. Application Data

(62) Division of application No. 11/478,449, filed on Jun. 30, 2006, now Pat. No. 8,025,729.

(60) Provisional application No. 60/697,826, filed on Jul. 8, 2005.

(30) Foreign Application Priority Data

Jul. 1, 2005 (DE) .......................... 10 2005 030 851

(51) Int. Cl.
*H01L 21/8252* (2006.01)
*C30B 33/02* (2006.01)
(Continued)

(52) U.S. Cl.
CPC ................. *C30B 33/02* (2013.01); *C30B 11/00* (2013.01); *C30B 29/40* (2013.01); *C30B 29/42* (2013.01);
(Continued)

(58) Field of Classification Search
CPC ........ C30B 29/42; C30B 11/00; C30B 33/02; H01L 21/02395; H01L 2924/10329
USPC .......... 117/7, 84, 89, 92, 95, 97; 428/64, 156, 428/172, 219, 409, 688
See application file for complete search history.

(56) References Cited

U.S. PATENT DOCUMENTS 3,462,323 A * 8/1969 Groves ............................ 117/99
3,897,281 A * 7/1975 Gilbert et al. ................... 117/57
(Continued)

FOREIGN PATENT DOCUMENTS

DE 690 20 802 T2 7/1995
DE 103 03 437 A1 9/2003
(Continued)

OTHER PUBLICATIONS

Mcelroy Translation Company, English Translation of JP 61151099, p. 1-8 (2014).*

(Continued)

*Primary Examiner* — Matthew Song
(74) *Attorney, Agent, or Firm* — Foley & Lardner LLP

(57) ABSTRACT

A device for heat treating (annealing) a III-V semiconductor wafer comprises at least one wafer support unit which is dimensioned such that a cover provided above the wafer surface is either spaced without any distance or with a distance of maximally about 2 mm to the wafer surface. A process for heat treating III-V semiconductor wafers having diameters larger than 100 mm and a dislocation density below $1 \times 10^4$ cm$^{-2}$ is carried out in the device of the invention. SI GaAs wafers produced have an at least 25% increased characteristic fracture strength (Weibull distribution), an improved radial macroscopic and mesoscopic homogeneity and an improved quality of the mechano-chemically polished surface. The characteristic fracture strength is higher than 1900 MPa.

5 Claims, 3 Drawing Sheets

(51) Int. Cl.

| | |
|---|---|
| *C30B 11/00* | (2006.01) |
| *H01L 21/02* | (2006.01) |
| *C30B 29/40* | (2006.01) |
| *C30B 29/42* | (2006.01) |
| *C30B 35/00* | (2006.01) |

(52) U.S. Cl.
CPC .......... *C30B 35/00* (2013.01); *H01L 21/02395* (2013.01); *H01L 2924/10329* (2013.01); *Y10T 117/10* (2015.01); *Y10T 428/21* (2015.01); *Y10T 428/24479* (2015.01); *Y10T 428/24612* (2015.01); *Y10T 428/31* (2015.01)

(56) References Cited

U.S. PATENT DOCUMENTS

| | | | | |
|---|---|---|---|---|
| 4,062,706 | A | * | 12/1977 | Ruehrwein .................. 117/93 |
| 4,478,675 | A | * | 10/1984 | Akai .............. 117/17 |
| 4,547,256 | A | * | 10/1985 | Gurtler et al. ............. 438/535 |
| 4,725,565 | A | | 2/1988 | Oren et al. |
| 4,808,551 | A | * | 2/1989 | Mori et al. ................. 117/90 |
| 4,889,493 | A | * | 12/1989 | Otsuki et al. .............. 438/796 |
| 4,911,962 | A | | 3/1990 | Baumann et al. |
| 4,920,078 | A | * | 4/1990 | Bagley et al. ............. 438/779 |
| 4,999,082 | A | * | 3/1991 | Kremer et al. ....... 252/62.3 GA |
| 5,011,794 | A | * | 4/1991 | Grim et al. ................ 438/796 |
| 5,047,370 | A | * | 9/1991 | Yamamoto et al. ......... 438/745 |
| 5,137,847 | A | * | 8/1992 | Shimakura et al. .......... 438/745 |
| 5,170,226 | A | * | 12/1992 | Fukuzawa et al. ............ 257/14 |
| 5,219,632 | A | * | 6/1993 | Shimakura et al. ......... 428/64.1 |
| 5,275,687 | A | * | 1/1994 | Choquette et al. ............ 117/98 |
| 5,419,785 | A | * | 5/1995 | Twigg et al. ............. 148/33.2 |
| 5,426,068 | A | * | 6/1995 | Imaizumi et al. ............ 438/509 |
| 5,471,948 | A | * | 12/1995 | Burroughes et al. ........... 438/93 |
| 5,525,538 | A | * | 6/1996 | Twigg et al. .................. 117/8 |
| 5,710,407 | A | * | 1/1998 | Moore et al. ................ 219/405 |
| 5,725,658 | A | * | 3/1998 | Sawada ...................... 117/54 |
| 5,837,555 | A | * | 11/1998 | Kaltenbrunner et al. ..... 438/796 |
| 5,861,609 | A | * | 1/1999 | Kaltenbrunner et al. ..... 219/390 |
| 5,872,889 | A | * | 2/1999 | Kaltenbrunner et al. ..... 392/418 |
| 5,985,678 | A | * | 11/1999 | Kiyama .......................... 438/5 |
| 6,007,622 | A | * | 12/1999 | Kawase et al. ................ 117/82 |
| 6,074,479 | A | * | 6/2000 | Adachi et al. ............. 117/204 |
| 6,127,288 | A | * | 10/2000 | Kiyama .................... 438/795 |
| 6,180,269 | B1 | * | 1/2001 | Hagi et al. ................. 428/697 |
| 6,184,498 | B1 | * | 2/2001 | Kiyama ..................... 219/390 |
| 6,235,543 | B1 | * | 5/2001 | Kiyama .......................... 438/5 |
| 6,325,849 | B1 | * | 12/2001 | Hideo et al. ................ 117/82 |
| 6,516,743 | B2 | * | 2/2003 | Iguchi et al. ........... 118/723 VE |
| 7,229,493 | B2 | | 6/2007 | Tsuchida et al. |
| 7,449,071 | B2 | * | 11/2008 | Aggarwal et al. ............. 118/725 |
| 7,566,641 | B2 | * | 7/2009 | Liu et al. ................. 438/478 |
| 2001/0023022 | A1 | * | 9/2001 | Nishiura et al. ............. 428/409 |
| 2002/0030198 | A1 | * | 3/2002 | Coman et al. ............... 257/103 |
| 2004/0173315 | A1 | * | 9/2004 | Leung et al. ........... 156/345.37 |
| 2006/0183329 | A1 | * | 8/2006 | Leung et al. ................ 438/689 |
| 2007/0012242 | A1 | * | 1/2007 | Jurisch et al. .............. 117/200 |
| 2008/0311417 | A1 | * | 12/2008 | Eichler et al. ................ 428/544 |
| 2009/0104423 | A1 | * | 4/2009 | Jurisch et al. ................ 428/220 |

FOREIGN PATENT DOCUMENTS

| | | |
|---|---|---|
| DE | 699 06 209 T | 9/2003 |
| EP | 0 174 010 B1 | 12/1990 |
| EP | 0 399 662 B1 | 7/1995 |
| EP | 1 122 342 A1 | 8/2001 |
| JP | 58-143520 A | 8/1983 |
| JP | 61-151099 A | 7/1986 |
| JP | 61151099 A * | 7/1986 |
| JP | 63-007624 A | 1/1988 |
| JP | 02-303121 A | 12/1990 |
| JP | 04-215439 A | 8/1992 |
| JP | 5-82527 A | 4/1993 |
| JP | 6-053639 B2 | 7/1994 |
| JP | 6-295863 A | 10/1994 |
| JP | 6-302532 A | 10/1994 |
| JP | 2545477 B2 | 7/1996 |
| JP | 25454477 B2 | 7/1996 |
| JP | 8-255799 A | 10/1996 |
| JP | 8-259396 A | 10/1996 |
| JP | 08-330397 A | 12/1996 |
| JP | 9-194300 A | 7/1997 |
| JP | 9-199508 A | 7/1997 |
| JP | 10-036197 A | 2/1998 |
| JP | 10-287500 A | 10/1998 |
| JP | 10-289883 A | 10/1998 |
| JP | 10-321540 A | 12/1998 |
| JP | 11-097448 A | 4/1999 |
| JP | 2000-294561 A | 10/2000 |
| JP | 2001-135590 A | 5/2001 |
| JP | 2002-274999 A | 9/2002 |
| JP | 2004-002075 A | 1/2004 |

OTHER PUBLICATIONS

M. Jurisch, U.S. PTO Office Action, U.S. Appl. No. 11/478,449, dated Jan. 8, 2010, 17 pages.
M. Jurisch, U.S. PTO Final Office Action, U.S. Appl. No. 11/478,449, dated Jun. 22, 2010, 10 pages.
Manfred Jurisch, U.S. PTO Office Action, U.S. Appl. No. 11/478,449, dated Sep. 3, 2009, 11 pgs.
O. Oda et al., "Recent developments of bulk III-V materials: annealing and defect control", Inst. Phys. Conf. Ser. No. 135: Chapter 8, pp. 285-294, 1993.
TH. Bunger et al., "Development of a vertical gradient freeze process for low EPD GaAs substrates", Materials Science and Engineering B80, pp. 5-9, 2001.
M. Naumann et al., "Laser scattering experiments in VCz GaAs", Journal of Crystal Growth 00, pp. 1-4, 1999.
R. Stibal et al., "Contactless evaluation of semi-insulating GaAs wafer resistivity using the time-dependent charge measurement", Semicond. Sci. Technol. 9, pp. 995-1001, 1991.
D. Rumsby et al., "Improved uniformity of LEC undoped gallium arsenide produced by high temperature annealing", GaAs IC Symposium, pp. 34-37, IEEE 1983.
H. Wenzl et al., "Defect Thermodynamics and Phase Diagrams in Compound Crystal Growth Processes", Handbook of Crystal Growth, vol. 1, pp. 103-119, 1993.
DIN EN 843-5 (draft) , pp. 1-14, Jan. 2005.
P. Silverberg et al., "Hole photoionization cross sections of EL2 in GaAs", Appl. Phys. Left. 52, pp. 1689-1691, 1988.
M. Wickert et al., "Physikalische Mechanismen der Homogenisierung elektrischer Eigenschaften von GaAs-Substraten" ("Physical mechanisms of the homogenization of electric properties of GaAs substrates"), Inaugural-Dissertation, Faculty of Physics, Univers. Freiburg, German, 1998.
B. Michel et al., Proceedings, Micro Materials, MicroMat 2000.
F. Duderstadt, "Anwendung der von Karman'schen Plattentheorie und der Hertz'schen Pressung fur die Spannungsanalyse zur Biegung von GaAs-Wafern im modifizierten Doppelringtest" (Application of the Karman plate theory and the Hertz pressing for the tension analysis for the bending of GaAs wavers of the modifed double ring test), Technical UNivers. Berlin, 2003.
Biberin V I Et al., "Effect of Heat Treatment on the Fracture Toughness of Gallium Arsenide Single Crystals", XP-002398006, EIX85100144655, Summary—Tsvet Met, Mar. 1985.
P.W. Atkins, "Physical Chemistry," $2^{nd}$ edition 1983, Oxford University Press, ISBN (code): 0-19-855150-9, pp. 909-913.
M. Jurisch, U.S. PTO Notice of Allowance, U.S. Appl. No. 11/478,449, dated May 12, 2011, 8 pages.
T. Cordner et al., GaAs Wafer Breakage: Causes and Cures, Growth and Process, published in 1993 IEEE GaAs Symposium, pp. 317-320.
DIN EN 843-5: 2006 (E), Advanced Technical Ceramics—Mechanical Properties of Monolithic Ceramics at Room Temperature—Part 5: Statistical Analysis, 2007, pp. 1-45.
P. Rudolph et al., "Bulk Growth of GaAs: An overview", published in Journal of Crystal Growth, 1999, pp. 325-335.

(56) References Cited

OTHER PUBLICATIONS

D. Rumsby et al., "Improved Uniformity of LEC Undoped Gallium Arsenide Produced by High Temperature Annealing", published in 1983 IEEE GaAs IC Symposium, pp. 34-37.

T. Flade et al., "State of the art 6" SI GaAs wafers made of conventionally grown LEC-crystals, published in Journal of Crystal Growth 198/199, 1999, pp. 336-342.

M. Schaper et al., "Fracture Mechanical Evaluation of GaAs Wafers", published in Mat. Res. Soc. Symp. Proc., vol. 744, 2003, pp. 29-34.

* cited by examiner

DEVICE AND PROCESS FOR HEATING III-V WAFERS, AND ANNEALED III-V SEMICONDUCTOR SINGLE CRYSTAL WAFER

CROSS-REFERENCE TO RELATED PATENT APPLICATIONS

The present application is a divisional of U.S. application Ser. No. 11/478,449, filed Jun. 30, 2006, now U.S. Pat. No. 8,025,729, which claims the benefit under 35 USC 119(e) of U.S. Application 60/697,826, filed Jul. 8, 2005 and also claims the right of foreign priority under 35 U.S.C. §119(a) based on Federal Republic of Germany Application No. 10 2005 030 851.1, filed Jul. 1, 2005, the entire contents of all of which are incorporated herein by reference in its entirety.

BACKGROUND OF THE INVENTION

The invention relates to a device and a process for heat treating (also referred to as annealing) of III-V wafers (also called substrates), and to annealed wafers or substrates. The invention particularly relates to the aforementioned device, process and wafer based on GaAs semiconductor materials, above all of semi-isolating (SI) GaAs wafers, as well as GaAs wafers produced according to the VGF (Vertical Gradient Freeze) and the VB (Vertical Bridgman) process. Because the electric, electronic and other physical properties of such annealed wafers are adjustable, they are particularly suited for the manufacture of active microelectronic devices based on III-V semiconductors.

In the crystal growth process from a melt, the solidified material goes through a thermal history dependent of location. That is, the effective maintenance time in a certain temperature range, in which balancing or compensation processes (e.g. relaxation of residual strength, homogenization, etc.) are possible, varies for different parts of a crystal. Therefore, it is common practice to subject single crystals to an equational heat treatment after the termination of the crystal growth process, either in the growth apparatus or preferably in a separate heating furnace. The annealing of GaAs single crystals was first applied by RUMSBY et al. (D. Rumsby, R. M. Wafer, B. Smith, M. Tyjberg, M. R. Brozel, E. J. Foulkes: *Tech. Dig. GaAs IC Symp.*, New York, IEEE, 1983, 34) for strain relaxation and homogenization of electrical properties of non-doped, semi-insulating LEC Liquid Encapsulated Czochralski)-GaAs single crystals. Since then, the crystal annealing processes have been systematically optimized, specifically with respect to the application and the customer; and in addition to homogenization, they also serve for the control of defect sites. An overview of crystal annealing of GaAs is given, inter alia, by ODA et al. (O. Oda, H. Yamamoto, K. Kainosho, T. Imaizumi, H. Okazaki: "Recent developments of bulk III-V materials: annealing and defect control," *Inst. Phys. Conf. Ser. No* 135, pp 285-293, 1993).

The basic physical mechanism of each heat treatment is the diffusion of intrinsic defect sites and impurities under the consideration of possible factors, such as Fermi level and dislocations, which possess increased diffusibility ("pipe diffusion") and with which point defects may react (segregation). Due to the smallness of the self diffusion coefficients and many extrinsic diffusion coefficients even close to the melting temperature of GaAs, the equational processes affected thereby are limited to mesoscopic linear dimensions (O(100 µm)). In particular, a homogenization of axial and radial concentration inhomogeneities, which are formed by macrosegregation of dopants and impurities during crystal growth, is not possible by crystal annealing.

Specifically, GaAs has a homogeneity region that includes the stoichiometric composition, with a retrograde solubility at least on the As-rich side of the homogeneity region (H. Wenzl, W. A. Oates, K. Mika: "Defect thermodynamics and phase diagrams in compound crystal growth processes," in: D. T. J. Hurle (ed.): *Handbook of Crystal Growth*, vol. 1A, North-Holland, Amsterdam, 1993). A consequence of the retrograde solubility is the formation of As precipitates when exceeding the solidus line during the cooling procedure, which is coupled with changes in the intrinsic defect inventory of GaAs ("structural point defects"). A distinction is made between matrix precipitates and decoration precipitates having different size distributions, which are formed by homogenous and heterogenous nucleation, respectively. The size distribution of the decoration precipitates (DP) additionally depends on the dislocation density of the material. The lower the dislocation density, the higher the average size of the precipitates. That is, VGF/VB-GaAs, in particular that having SI properties, has larger, greater DP compared to LEC-GaAs. On the other hand, LEC-GaAs, though having a smaller sized DP, has a relatively high dislocation density of substantially above $1\times10^4$ cm$^{-2}$. Dissolving the precipitates by a holding step in the homogeneity region, and re-precipitating the excessive arsenic by means of a defined cooling process thus represents—considering the distribution and the amount of deposited arsenic—a possibility to control not only the defect inventory, but also of the As precipitates by means of crystal annealing. However, heat treating single crystals of large dimensions poses strict limitations on the realizable heating and cooling rates in view of the physico-thermal properties of GaAs, if thermal strain is to lie below certain limits in favor of a constant dislocation density, or for the avoidance of fractures.

During mechano-chemical polishing of the wafers, the As precipitates cause etch pit-like defects in the surface, which are detectable by light scattering techniques as so-called COPs (Crystal Originated Particles) and are classified depending on their size, and which must meet specifications of the use and the user. The size distribution of the COPs depends, inter alia, on the respective polishing procedure; however, it is basically proportional to the size distribution of the As precipitates. That is, on the average, the COPs are larger in VGF/VB-GaAs than in the LEC material. COPs may disturb epitaxial growth and may cause an unacceptable "roughness" of the stacked layers in the manufacture of device elements. Moreover, it is known that the As precipitates affect the circuit behavior of FETs produced by ion implantation (U.S. Pat. No. 5,219,632).

Besides the common practice of carrying out annealing of the whole crystal (ingot), a heat treatment of single wafers, the so-called wafer annealing, is known. There, different from crystal annealing, use can be made of the fact that, with GaAs (and other III-V compounds), arsenic (i.e., the V component) has a higher vapor pressure than gallium (i.e. the III-component) above the temperature of the congruent evaporation. In this manner, it can be tried, at least in principle, to adjust the composition of GaAs in a surface-near region of the wafer by means of an As partial pressure, which is applied from the outside (for example, by evaporating solid arsenic, or by other means) (see O. Oda, H. Yamamoto, K. Kainosho, T. Imaizumi, H. Okazaki: "Recent developments of III-V materials: annealing and defect control," *Inst. Phys. Conf. Ser. No* 135, pp 285-293, 1993).

Another known variant of wafer annealing is heat treatment after ion implantation. It serves for the activation of implanted dopants, wherein a selective As evaporation is suppressed by an As partial pressure corresponding to the activation temperature, or by a diffusion barrier of $Si_3N_4$, AlN or another cover layer.

Starting from a 1-step wafer annealing procedure (U.S. Pat. No. 5,219,632), a 2-step (JP 01-153481 A, U.S. Pat. No. 5,047,370) and finally a 3-step procedure (JP 04-215439 A, U.S. Pat. No. 5,137,847) were developed in the wafer annealing for further improvement of the mesoscopic homogeneity.

These developments have in common that, in a first (in U.S. Pat. No. 5,219,632 the only) annealing step at T>1100° C. and t>30 min in a quartz ampoule, the density of the so-called micro defects of typically $5 \times 10^5$ cm$^{-3}$ in SI LEC GaAs is decreased to $\leq 5 \times 10^3$ cm$^{-3}$ under a not further defined As partial pressure, for the avoidance of a selective As evaporation, and by a subsequent cooling to room temperature at a rate of 1-30 K/min. Micro defects are defined as deposits of impurities or As precipitates that can be detected by the known AB etching as oval etch pits on the wafer surface. Preferably, lapped or purity-etched wafers, optionally also in the as-grown status, are used. After double sided etching of the annealed wafers, the second annealing at 750° C.-1100° C. (preferable at 900° C.-1000° C.) is carried out for at least 20 min. Again, it is annealed in a quartz ampoule, but now in a non-oxidizing atmosphere, such as, e.g., $N_2$, $H_2$, Ar or also $AsH_3$, with a not further specified pressure, i.e., non-conservative without As potential and therefore under extracting conditions, or alternatively in a conservative manner with an As partial pressure for suppressing degradation of the surfaces. The indications on the process gas are therefore contradictory. This manner of operation may, however, be provisionally contemplated, to the extent that the wafers are etched, pre-polished and finally polished after the annealing, so that a possibly changed composition in the region close to the surface is of no importance.

In the publications JP 08-255799 A, JP 08-259396 A and JP 09-194300 A, the second annealing in a T range of 800° C.-1000° C. is carried out under an As partial pressure, which is at least 1.4- to 2-fold of the pressure above stoichiometric GaAs at the respective temperature. Thereby, the stoichiometric imbalance and the EL2 concentration associated therewith are increased in a region near the surface. The publications are silent on the behavior of As precipitates during this heat treatment.

In the 3-step wafer annealing described in U.S. Pat. No. 5,137,847 or JP 04-215439 A, a further annealing is carried out at 520-730° C. under As partial pressure. In this document, the 3-step annealing is indicated as being optimal with respect to homogenization and a decrease of micro defects.

The high cooling rate demanded after the first annealing step is disadvantageous and unacceptable, because it leads with high probability to a multiplication of dislocations (slip line formation) based on too high of a thermal strain. This is consistent with the Japanese laid-open patent application JP 2002-274999 A, which limits the heating and cooling rates to $\leq 200$ K/h or $\leq 100$ K/h, as well as with JP 2001-135590 A, which relates to a certain temperature scheme wherein both the heating and the cooling rates are changed depending on the temperature T. However, it was not noticed that critical heating and cooling rates should be different for the avoidance of a multiplication of dislocations for LEC-GaAs and VGF-GaAs, respectively. Furthermore, the amount of material and labor drastically increases concurrent with the number of annealing steps.

In JP 09-199508 A, it is disclosed to stack the GaAs wafers to be annealed one above another, to press them together via an elastic element under a defined pressure, and to anneal them in this manner under a non-oxidizing atmosphere ($N_2$, Ar, $H_2$, $AsH_2$) in a container in a temperature range between 800-1000° C.

JP 05-082527 A discloses a device for annealing wafers in a vertical arrangement. The device consists of 3 azimutally displaced support rods having cuts at defined intervals for receiving the respective wafer. The support rods are fixed to a cone flange. They are formed in a hollow manner, may receive one or more thermo elements and may be supplied by a cooling gas. This device is inserted into a vertically arranged quartz ampoule having a corresponding cone cutting. The ampoule has an extension at its lower extremity for receiving metallic arsenic. The extension projects into a separate heater, the temperature of which controls the As partial pressure in the ampoule and thereby avoids a degradation of the wafers. The wafers are heated by a furnace having several separate heaters, which are controlled by means of an inner thermal element, such that a constant temperature may be maintained over the whole insert length of the wafers. The ampoule may be evacuated. The ampoule having the wafers inserted therein may be closed through a cone cutting, or may be melt sealed as well.

Instead of one wafer for each level, two backside contacted GaAs wafers may also be inserted according to JP 2000-294561.

According to JP 06-302532 A, and likewise in JP 10-287500 A and JP 10-289883 A, the wafers are laid on supports made of heat resistant materials, such as pBN, graphite, silicon, tungsten, molybdenium, and these supports are stacked vertically or horizontally and are inserted into the annealing ampoule in this matter. In the horizontal storage of the wafers on supports, borings between the wafer supports serve for a better exchange with the process gas (see JP 10-321540 A).

EP 0 399 662 A describes a process for annealing semiconductors of the type $A_3B_5$ (III-V) and $A_2B_6$ (II-VI), wherein the semiconductor having its surface encapsulated by a glass encapsulation film is subjected to a fast thermal annealing (RTA) in order to anneal defects caused by ion implantation. In a treatment device, a cover 12 is provided above a wafer 1 having a thickness of about 500 µm through a spacer ring 11, which typically has a height of 600 to 900 µm, so that a free space of at least 100 µm is formed for allowing the wafer to expand and for enabling a homogeneous heat transfer to the wafer. The encapsulation film intentionally provides a barrier above the wafer surface, such that no (mass) transport is possible between the semiconductor material of the wafer and the free space.

SUMMARY OF THE INVENTION

It is one object of the present invention to provide a device and a process for a cost-effective production of III-V wafers, preferably of GaAs single crystals, and particularly of VGF/VB produced wafers.

It is also an object of the invention to provide such wafers, which possess a good homogeneity of electrical and physical properties, as well as an improved surface quality.

In accomplishing one or more of these objects, there is provided according to one aspect of the present invention a device for heat treating at an increased temperature at least one wafer, at least the surface of which wafer comprises a III-V semiconductor material. The device comprises at least one wafer support unit comprising a wafer support surface and a cover surface, the wafer support unit being dimensioned such that, after laying a wafer to be heat treated onto the support surface, the cover surface is located above the III-V semiconductor material-comprising surface of the wafer to be heat treated, at a pre-determined distance that ranges from 0 to a distance of up to about 2 mm with respect to the surface of the wafer.

In accordance with another aspect of the invention, there is provided a process for heat treating at an increased temperature a wafer comprising, at least at a surface thereof, a III-V semiconductor material, the wafer having a diameter of ≥100 mm, wherein the process comprises:

placing one or more wafer having a diameter of ≥100 mm in an interior space of a heating furnace or container; heating the wafer at an increased temperature, under a condition wherein a limited gas exchange is ensured between the surface of the wafer to be heat treated and the interior space of the heating furnace or container, such that precipitates of the V component are substantially reduced in size and/or density in a surface layer of the III-V semiconductor material-comprising surface of the wafer.

In accordance with another aspect of the invention, there is provided a process for heat treating at an increased temperature a wafer comprising, at least at a surface thereof, a GaAs semiconductor material, wherein the process comprises: providing a wafer comprising, at least at a surface thereof, the GaAs semiconductor material, the wafer having a diameter of ≥100 mm, heating the wafer at an increased temperature, under a condition that extracts As from a region of the GaAs-comprising surface, thereby substantially reducing density and/or size of As-precipitates in the surface region, the surface region being at least about 5 μm or more in thickness, preferably at least about 10 μm or more and particularly at least about 20 μm or more in thickness.

In accordance with still a further aspect of the invention, there is provided a process for heat treating at an increased temperature a wafer comprising, at least at a surface thereof, a III-V semiconductor material, the wafer having a diameter of ≥100 mm, wherein the process comprises heating at least one wafer at an increased temperature, under a condition wherein the III-V semiconductor material-comprising surface of the wafer is either directly covered by a material that is gas-permeable, or is covered by a material positioned above said surface of the wafer at a distance of more than 0 mm and up to about 2 mm.

In accordance with still another aspect of the invention, there is provided a process for heat treating at an increased temperature at least one wafer comprising a III-V semiconductor material and having a diameter of ≥100 mm, comprising, after a step for purifying and etching, and before a step for edge-grinding, heating the at least one wafer at an increased temperature in a heat treatment device that is free of quartz and that comprises at least one wafer support surface.

The present invention also provides, in another aspect, a GaAs single crystal wafer having a diameter of ≥100 mm, a dislocation density of about ≤1×10$^4$ cm$^{-2}$, and a characteristic fracture strength, up to which about 63.2% (Weibull distribution) of wafers have failed, that is at least about 25% higher than that of SI GaAs wafers from crystal annealed material.

The present invention also provides, in still another aspect, a GaAs semiconductor single crystal wafer having a diameter of ≥100 mm, a dislocation density of about ≤1×10$^4$ cm$^{-2}$, and a characteristic fracture strength, up to which about 63.2% (Weibull distribution) of wafers have failed, that is higher than about 1900 MPa.

Further objects, features and advantages of the present invention will become apparent from the detailed description of preferred embodiments that follows, when considered together with the accompanying figures of drawing.

DETAILED DESCRIPTION OF PREFERRED EMBODIMENTS

Figure 1:
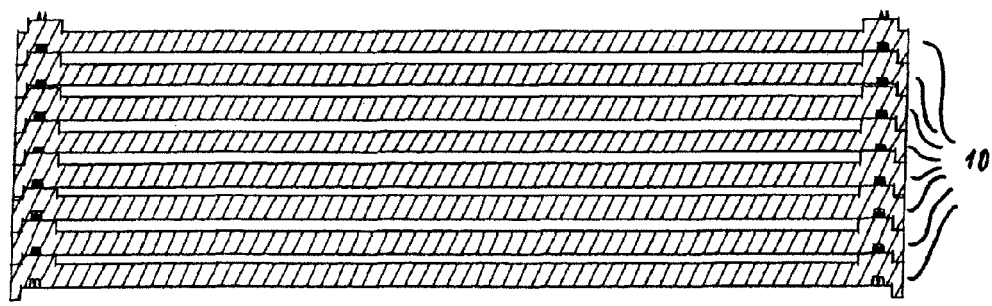
FIG. 1 is a cross sectional view, schematically showing one embodiment of stacked annealing cassettes comprising a plurality of single wafer support units according to the invention.

The device for heat treating (annealing) wafers, which preferably comprise a III-V semiconductor material at least at the surface to be annealed, comprises a wafer support unit which is defined in its dimensions such that, after laying the wafer to be annealed onto the support, a cover is provided above the wafer surface, the cover is not substantially spaced apart or is spaced apart maximally about 2 mm with respect to the wafer surface.

The III-V semiconductor material-comprising surface typically is the upper (or front) surface of the wafer which is later used as a functional side for the formation of a semiconductor device or the like. The III-V semiconductor material may be contained at least in the surface of the wafer to be heat treated, or may be contained in the whole wafer. For example, the wafer may be made of the III-V semiconductor material by separation from an as-grown or bulk III-V compound semiconductor crystal.

The effect of the invention is particularly good, if the cover is formed by a covering which extends over the whole surface of the wafer to be annealed.

The wafer support unit preferably enables a pressure-free support of a single wafer per support unit, e.g., only with its dead load.

The bottom and/or the cover of the wafer support, preferably both the bottom and the cover, are preferably either completely or partially gas permeable, e.g., by an open-porous and particularly a microporous structure with open porosity. Optionally, the bottom and/or cover are only partially gas permeable in a surface area facing to the wafer. The preferably gas permeable material of the bottom and/or the cover of the support preferably has a high heat conductivity and a high flatness. Suitable gas permeable materials, for example, are graphite, ceramics such as, e.g., Al$_2$O$_3$, and cermets, with an appropriate open porosity. The gas permeability of the bottom and/or the cover of the wafer support unit is suitably 1.0 cm$^2$/s or lower, preferably 0.50 cm$^2$/s or lower, more preferably 0.10 cm$^2$/s or lower, and in particular 0.05 cm$^2$/s or lower (e.g. measured for air as a reference gas at ambient pressure and ambient temperature according to DIN51935). The gas permeability and porosity may be adjusted depending on the material used and the desired conditions (wafer material, annealing temperature, distance of the support bottom to the cover, etc.) by methods known to the person skilled in the art, wherein preferably the bottom and/or the cover of the wafer support should have open pores at least in the surface facing the wafer surface. The open porosity (measured e. g. according to DIN51918) of the porous material for the bottom and/or the cover of the wafer support may suitably be 20 vol. % or lower, preferably 15 vol. % or lower, and more preferably 10 vol. % or lower. It is also possible to make the wafer porous or gas permeable only in a portion of the bottom and/or the cover of the wafer support, which portion surrounds the inserted wafer, whereas the remaining portion is coated by a gas-impermeable material having a high heat conductivity, such as sapphire ($Al_2O_3$), $SiO_2$-bonded $ZrO_2$, or SiC. Good results have been achieved also with a SiC-coated graphite cassette forming the bottom and the cover of the wafer support, which is gas-impermeable except for the region of a diffusion barrier (described in further detail below), i.e., in the periphery where stacked cassettes of wafer support units contact each other. For the bottom and/or the cover of the wafer support, a material is preferred which is made by pressing graphite. More preferably, the material is composed of ultrapure graphite particles, because of the particularly high heat conductivity and high flatness achievable thereby. However, also suitable are other, preferably ultrapure materials or mixtures of different materials, which can be strongly pressed to a residual porosity. Preferably, the cover is made of the same gas permeable, porous material as the support bottom. This may be realized, for example, in the embodiment of the cassette form described in more detail below.

Providing a limited distance and/or optionally providing the pore structure defines a micro volume. The III-V semiconductor-comprising surface to be annealed is not encapsulated or covered by another material. Rather, this surface has contact to the aforementioned micro volume due to the limited distance to the cover and/or the porosity of the cover material. Thus, a (mass) transport can take place between the III-V semiconductor material and the micro volume defined above the III-V semiconductor-comprising surface. In particular, it is possible that an advantageous transport and/or exchange of the V-component, such as, e.g., As or P, can take place. On the one hand, a degradation of the surfaces under the formation of Ga droplets is surely excluded, and on the other hand, wafers having enhanced use properties can thereby be prepared in a particular efficient manner. Both an improved surface quality is achieved, by decreasing the COPs, and the characteristic fracture strength of the annealed wafer is significantly improved. It is believed that a particularly good homogenization of the surface region of the annealed wafers is effected by means of the defined micro volume. The effect is particularly excellent, if the wafer support unit is defined in its dimensions such that the distance between the surface of the wafer to be supported and the cover or covering laid on top thereof is about 0.05-0.75 mm, further preferably about 0.2-0.5 mm and, in particular, about 0.3-0.4 mm, and forms a corresponding micro volume. For example, referring to a preferred, non-limiting, typical wafer thickness of about 0.5-1 mm, the distance between the bottom of the support and the cover of the corresponding wafer support unit is at least about 0.5 mm (i.e., in a gap-free overlay of the cover on the wafer when using a 0.5 mm-thick wafer) and varies up to maximally about 3 mm (i.e., applying the maximum distance of the wafer to the cover of 2 mm, when using a 1 mm-thick wafer). The wafer support unit is further defined in its dimension such that, preferably, a volume diameter is defined that is larger and in particular only slightly larger than the diameter of the wafer to be treated, for example, corresponding to maximally 110%, preferably maximally 105%, or further preferably maximally 101% of the diameter of the wafer to be treated.

In one particular preferred embodiment of the invention, the wafer support unit may form a limited, wafer-receiving space such that an unhindered free gas access to the wafer surfaces is at least decreased and is preferably not possible. On the other hand, a hermetic sealing of the wafer in the support unit is not desirable. Therefore, there is preferably a certain minimum gas exchange rate between the atmosphere inside the micro volume and the atmosphere outside the wafer support unit; however, the gas exchange rate is substantially decreased in comparison with a free gas exchange. The practical realization is typically accomplished by the provision of a gas permeability or open porosity as mentioned above, and/or by the provision of a further diffusion barrier which will be described in further detail below.

The wafer support unit is preferably designed to allow a continuous, horizontally flat-extending support of the whole lower surface of the wafer. In order to make the support as uniform as possible, suitably no borings or openings are provided in the support bottom. The invention permits strains to be avoided which would occur in the annealing treatment by the influence of the dead weight of the wafer, if supported neither horizontally nor continuously uniformly and in particular if supported at individual points, because the yield stress (which is temperature-dependent) is exceeded by the load gravity within the annealed material, resulting in the formation of dislocations and unacceptable slip lines. This influence is particularly pronounced in GaAs due to its comparatively high density.

Further advantages are homogenous (radial) temperature distributions during heating and cooling, as well as during holding the temperature, in turn resulting in the avoidance of thermally generated strain in the wafers, and in the avoidance of global changes of the geometry of the wafer (deterioration of e.g., "warp" in comparison with the state before annealing) and of local difference in the interaction between wafer and process gas. Heating and cooling rates may therefore be controlled in a better and temperature-variable manner.

According to the invention, the interaction between the process gas and the wafer surface can be made uniform and be rendered independent of the global geometric quality as well as the physico-chemical surface state of the wafer.

By preferably supporting only a single wafer per wafer support unit, a mutual inter-sintering of wafers can be avoided. Here, a wafer is not covered by another wafer.

It is particularly preferred that the device comprises a plurality of wafer support units, wherein the units can be stacked in cassette form, in such a manner that a wafer support unit forms a bottom support for a first (nth) wafer, whereas a corresponding wafer support unit for a second ((n+1)th) wafer, laid above and stacked on the first (nth) wafer, forms the height limiting cover or covering for the space of the first (nth) wafer.

The wafer support unit, in its single form or its multiple stacked cassette form, comprises an appropriate outer periphery, which is formed around the circular edge of the wafer to be treated and which closes the space of the micro volume to the outside. The outer periphery preferably comprises a gas diffusion barrier, in order to enable an additionally controlled or limited gas exchange between the outside and the micro volume. This is suitably embodied by an appropriate structured form and/or material selection in the contact region of adjacent wafer support units, in particular at the contact faces therebetween. Suitable measures are, for example, cover/support-structures that do not hermetically exclude gas exchange. For example, between adjacent wafer support units an inner periphery of the bottom of the top-laying wafer support unit is engaged in the outer periphery of the below-lying wafer support unit, and/or a surface roughness or another diffusion inhibiting geometric structure is provided. An alternative or additional diffusion barrier is possible by forming a diffusion barrier material, such as $Si_3N_4$, AlN or the like, at the contact faces at the circular edge of adjacent wafer support units. Particularly simple and effective diffusion barriers are formed by one or more ridges (e.g. in triangular cross-sectional form) circumferentially extending at the periphery of the wafer support unit, which ridges engage in grooves of corresponding cross section of the adjacent wafer support unit.

Thus, limited gas exchange between the III-V semiconductor-containing wafer surface and the outside may be controlled by any one of the measures, alone or in combination, of providing a limited distance between the wafer surface and the cover surface of the wafer support unit, a gas permeability or an open porosity in the cover surface and/or the support surface of the wafer support unit, and an additional diffusion barrier respectively described above.

For the annealing process, the wafer is inserted into the device such that the front or upper side of the wafer, which later forms the functional side of the wafer, faces the micro volume. For obtaining large wafers having improved properties, it is advantageous that the wafer comprising the III-V semiconductor material is first separated from the as-grown III-V single crystals having a diameter of about >100 mm, optionally of about >150 mm or of about >200 mm after cylindrical grinding, for example, by means of wire lapping or in-hole-sawing. Subsequently, the wafer is subjected to a step of purifying and etching, and then, still before the step of edge-grinding is carried out, the wafer is heat-treated in a heat treatment device which is operated completely free of fused silica or quartz glass components, such as a quartz ampoule. The wafer support unit described above is particularly well suited for use in such a wafer treatment process, because it can be used in a heat treatment apparatus without fused silica or quartz components. The annealing in a quartz-free environment serves for decreasing the risk of contamination by e.g., Cu, resulting, for example, in the possibility to control the concentration of total impurities other than carbon and boron, preferably to at most about $5 \times 10^{14}$ $cm^{-3}$ and further preferably to at most about $2 \times 10^{14}$ $cm^{-3}$. Furthermore, the process can be carried out more easily and with reduced costs. Moreover, with the mentioned order of process steps, a uniform extraction in the surface region, and a homogenization of the wafer can be realized in a particular excellent manner. The subsequent processing of the wafers after annealing is carried out analogously to the procedure of crystal-annealed wafers. The edge-grinding is advantageously carried out after the annealing of the single wafer, to eliminate inhomogeneities or defects at the peripheral wafer edge that may be still present.

By applying the concept of the present invention, a process is also provided for heat treating a wafer prepared by separation from a single crystal having a diameter of ≥100 mm and comprised of a III-V semiconductor material at least at a surface thereof, wherein the wafer is heat treated at an increased temperature in a status wherein said surface of the wafer is either directly covered by a gas-permeable and/or a porous material, or is covered by a material, which may or may not be gas-permeable and/or porous, at a distance above the surface of the wafer of more than 0 mm to maximally about 2 mm.

By these alternative measures, a micro volume is created above the III-V semiconductor-containing surface to be treated, which micro volume allows for a transport and/or an exchange of the V-component, such as, e.g., As or P, into the micro gas space, or from this micro gas space.

The covering material, i.e., the gas-permeable and porous form as well as the bulk form, is solid and heat resistant. Preferred materials are graphite, ceramics, such as $Al_2O_3$, and cermets, as mentioned above. If the gas-permeable and porous form is chosen, a suitable open porosity is adjusted, for example, by pressing the aforementioned starting materials in particulate form, e.g., graphite particles. Preferably, the edges as well as the bottom surface of the wafer to be treated is surrounded by the mentioned material, either directly or with a distance as mentioned above.

The process according to the invention in the above described embodiments enables a one-step annealing instead of multiple-step annealing schemes. As a result, the costs for the heat treatment are reduced.

The annealing is preferably carried out in a temperature range of about 750-1150° C., further preferably of about 800-1050° C. The atmosphere is formed preferably of inert gas, e.g., by nitrogen or argon, and particularly having a hydrogen content of at least about 0.5 vol. % and having a total pressure of about 10-20 bar (about $1 \times 10^6$ to $2 \times 10^6$ Pa). In the case of preparing e.g., GaAs wafers, it is advantageously possible to carry out the annealing of as-grown wafers without a prescribed As partial pressure. It is believed that the use of the device according to the invention by itself generates a favorable As atmosphere in the micro volume mentioned above, in order to effect a controlled As extraction from the wafer surface, and/or an adjustment of the As distribution in the surface region of the wafer facing the micro volume. The gas atmosphere above the heat treated wafer surface is thus believed to contain As species in elementary form, such as $As_2$, $As_4$ and $As_n$ (n denoting other integral numbers, such as 1, 3, 5, 6, etc.), and carrier gas species. As a result, As-precipitates present in the GaAs wafer surface can be substantially reduced in size and/or density. In the case of preparing e.g., InP wafers, it may otherwise be advantageous to carry out the annealing of as-grown wafers in the presence of a prescribed P partial pressure, in order to effect a diffusion into, and/or an adjustment of the P distribution in the surface area of the wafer facing the micro volume.

Due to the particular ease of operation, the annealing treatment device according to the invention described above may simply be placed in a temperature constant space. As a furnace to be used, a multiple heater assembly is preferred; for example, a furnace comprised of a jacket heater and two (one at the floor and one at the top) cover heaters. The adjustment of an As partial pressure in the annealing furnace is not required and may be omitted in favor of ease and effectability of the annealing.

The period of maintaining the annealing temperature may be extended until obtaining a desired and, depending on the intended use, beneficial depth of an extraction (e.g., of As) or infusion (e.g., of P) of the V component, and/or an adjustment of the distribution of the V component, which can be determined e.g., by Laser Scattering Tomography (LST).

A preferred depth of an As extraction or P infusion and/or concentration adjustment of the V component is at least 40

µm. However, there is no limitation, and the depth may even extend throughout the whole thickness range of the wafer.

A relationship between the desired maintenance time of the annealing temperature and an average As extraction depth Leff is given by the following formula:

$$L_{eff} = \left(2 \int_0^{t_0} D(T[t']) dt'\right)^{1/2},$$

wherein D (T) is the transport coefficient of As (see also FIG. 6 below), and T(t) denotes the temperature/time-profile of the annealing (see, e.g., FIG. 4 below), the total period being denoted by $t_0$. For an approximation, the following formula applies: $L_{eff} = \sqrt{2D(T)t}$, wherein D(T) is the transport coefficient at the annealing temperature T, and t is the maintenance time at this temperature. In this regard, the heating and cooling periods of the annealing scheme remain unconsidered.

Further particular advantages of the process result from the possibility that the heating and cooling rates respectively can be variably adjusted in a temperature-dependent manner. Thus, one can efficiently decrease and increase the heating rate and the cooling rate from 30-40 K/min to 0, respectively, in the temperature range between 400° C. and the nominal annealing temperature.

A further advantage consists in that, if desired, the $EL2^0$-concentration of as-grown VB/VGF wafers having a dislocation density of about $<1 \times 10^4$ cm$^{-2}$ is increased by at least about 30%. Furthermore, both the $EL2^0$-concentration and the related mesoscopic resistance can be beneficially homogenized, in particular to a range of $|\Delta[EL2^0]/[EL2^0]| \leq$ about 7.5% and $\sigma_{mesos} \leq$ about 6%, respectively, and even to a range of $|\Delta[EL2^0]/[EL2^0]| \leq$ about 5% and $\sigma_{mesos} \leq$ about 5%, respectively. The surface quality is also significantly improved, which is particularly expressed in a strongly decreased (light point defects), for example a lpd (0.3-2.0 µm)<about 0.3 cm$^{-2}$.

By means of the mentioned advantageous embodiments of the process according to the invention, an unproblematic integration of the annealing treatment into the technological flow of the wafer manufacturing process is possible.

The III-V semiconductor wafer, particularly the single crystal SI GaAs wafer that is obtainable by the annealing device and the process according to the invention has an enhanced fracture strength, which is advantageous for the manufacture of semiconductor devices. Furthermore, these wafers have an improved radial microscopic and mesoscopic homogeneity and an improved quality of the mechano-chemically polished surfaces. It is believed that a reason for the improved properties resides in a concentration adjustment of chemical components, especially the V component of the III-V semiconductor compound, such as the As (in the case of GaAs) or P (in the case of InP), and/or a homogenization of physical parameters, such as the distribution of the EL2 concentration, which is achievable by the annealing device or the process according to the present invention. By the possibility of defining a micro volume and optionally of adjusting further process parameters, such as components and pressures of the gas atmosphere, a controlled extraction of the V component, i.e., As in the case of GaAs, or a controlled infusion of the V component, i.e., P in the case of InP, may be achieved by the wafer annealing units and the annealing cassettes according to the invention. Both the device and the process according to the invention are preferably applicable to a heat treatment of SI GaAs wafers produced from single crystals, which have been grown by the Vertical Bridgman Process (VB) and its modifications (e.g., the Vertical Gradient Freeze Process—VGF). These processes show significantly smaller non-linearities of the 3-dimensional temperature field in comparison with the Liquid Encapsulated Czochralski Process (LEC). III-V crystals grown by the VB/VGF process, and wafers produced therefrom, and in particular SI GaAs wafers having larger diameters such as ≥100 mm and ≥150 mm, show dislocation densities below $1 \times 10^4$ cm$^{-2}$, and the characteristic fracture strength, which is defined by the fracture strength, up to which 63.2% (Weibull distribution) of the wafers fail, is increased by at least about 25% in relation to that of SI GaAs wafers obtained from crystal annealed material. The characteristic fracture strength is higher than about 1900 MPa and preferably higher than about 2000 MPa, with a confidence interval of <±200 MPa. The characteristic fracture strength is measurable by standard methods, as described, for example, in DIN 51110/part 3 or EN843-5 (draft) or by W. Timischl: *Qualitätssicherung*, Carl Hanser Verlag München Wien, 1996, ISBN 3-446-18591-1. It is sufficient to apply a two-parametric Weibull distribution for the determination of the characteristic value.

With the process according to the present invention, in particular a III-V semiconductor single crystal wafer having a unique combination of features is obtainable. This combination of features is defined by one or more, preferably all of the following parameters:

wafer diameter ≥about 100 mm, preferably ≥about 150 mm;

dislocation density <about $1 \times 10^4$ cm$^{-2}$;

a concentration of impurities other than carbon and boron of totally ≤about $5 \times 10^{14}$ cm$^{-3}$, preferably of ≤about $2 \times 10^{14}$ cm$^{-3}$;

a homogeneity of the $EL2^0$ concentration of $|\Delta[EL2^0]/[EL2^0]| \leq$ about 7.5% and a mesoscopic homogeneity of $\sigma_{mesos} \leq$ about 6%, preferably $|\Delta[EL2^0]/[EL2^0]| \leq$ about 5% and $\sigma_{mesos} \leq$ about 5%; lpd (0.3-2.0 µm)<about 0.3 cm$^{-2}$.

Figure 2:
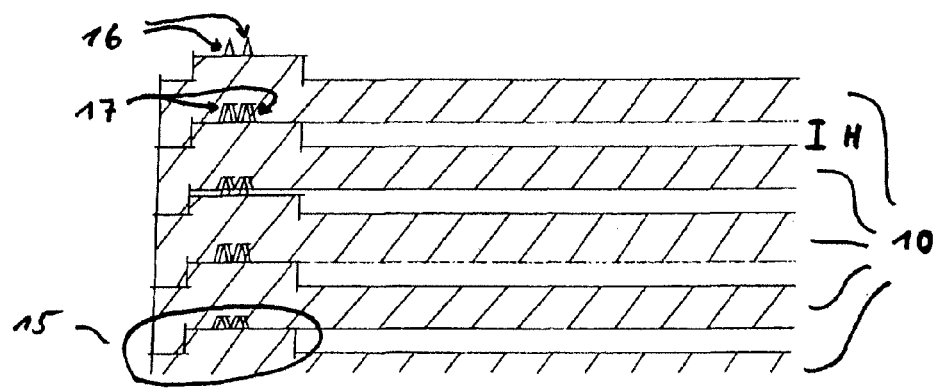
FIG. 2 is another cross-sectional view, schematically showing the embodiment according to FIG. 1 in further detail, with an embodiment for an additional diffusion barrier.

In FIG. 1, and in further detail in FIG. 2, stacked annealing cassettes comprising a plurality of individual wafer support units 10 are schematically shown in one embodiment of the invention. Each wafer support unit 10 may receive a respective wafer (not shown). The backside of the wafer lies on the floor or bottom of the respective cassettes that are preferably made of highest possible flatness from, e.g., highly dense, but gas-permeable graphite of high temperature conductivity (for the gas-permeable property, reference is made to the above description). The individual, respectively identical cassettes are made such that they are allowed to be stacked with direct contact at the peripheral edges, wherein the bottom of the overlaying cassette unit forms the cover closure of the underlying cassette unit, and a space (being adapted to a wafer thickness d and having the illustrated total height H) remains for receiving the wafer. Preferably, an additional free volume remains. A micro volume is formed by the open pore structure of the wafer support itself and, if in the preferred embodiment a distance (H-d) between the cover and the wafer surface is provided, by means of the free volume which is additionally formed according to the chosen distance. In the last mentioned case, the free volume is given by the distance to the wafer surface (not shown) of maximally 2 mm, preferably 0.5-0.75 mm, further preferably 0.2-0.5 mm, and in particular 0.3-0.4 mm height, as well as by the diameter of the support $2R_T$ of higher than the diameter of the wafer to be treated, e.g., maximally 110%, preferably maximally 105%, and further preferably maximally 101% of the diameter of the wafer to be treated. The free volume is closed to the outside by a cover/bottom engaging structure 15 at the peripheral edge. An additional gas diffusion barrier is preferably provided on the supporting edge of the wafer support units, being preferably formed on the underlying wafer support unit by circular ridges 16, which are engaged in corresponding grooves or recesses 17 of the overlaying covering wafer support unit (see FIG. 2). To provide a top cover of the stack of annealing cassettes, an unoccupied or a dummy wafer-occupied wafer support unit, or a special cover may be provided (not shown).

In this manner, a disadvantageous direct contact is avoided of individual wafers, such as takes place, e.g., in JP 09-199508 A. The number of useable cassettes (wafer support units) depends on the length of the temperature constant zone of the annealing furnace to be used; and in the embodiment exemplified here, the number is selected as 90. The diffusion barrier that is formed, e.g., from two circular triangular ridges and grooves (see FIG. 2), reduces the As loss from the micro volume during annealing essentially to an amount of diffusive transport through the microporous graphite. The cassettes with their micro volume therefore fundamentally differ from wafer support units described in the prior art according to, e.g., JP 05-082527 A and JP 06-302532 A, which allow a free gas access to the wafer surfaces. Moreover, the problems described above with respect to supports at points or at specific regions (see in particular JP 05-082527 A) are avoided by the support of the whole wafer main surface on the wafer support unit according to the invention. Furthermore, both heating to, and cooling from the annealing temperature can be accelerated, and temperature inhomogeneities over the wafer during the temperature holding period are thereby decreased.

The thickness of the wafer used corresponds to the sawed thickness, as in the conventional manufacturing process, i.e., the wafer annealing according to the invention does not require a modification of the dimensional chain of the wafer manufacturing process.

Figure 3:
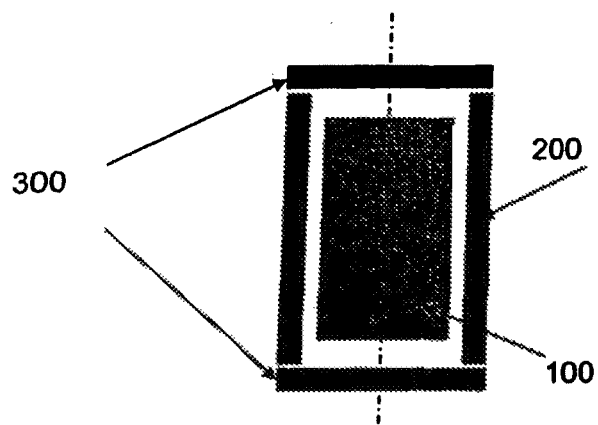
FIG. 3 is a schematic cross sectional view, showing an annealing furnace in which a stack of plural wafer support units is placed.

As schematically shown in FIG. 3, after placing wafers into the cassettes, a graphite tube which matches with the outer diameter of the cassettes is placed to enclose the cassette stack for the purpose of homogenization of the temperature field, and the graphite tube is then closed on both ends by graphite plates. The thus formed annealing assembly (denoted in FIG. 3 by reference numeral 100) is inserted into the temperature constant zone of a vertical cold wall annealing furnace. The furnace comprises a multiple heater assembly or contains, as shown in FIG. 3, a jacket heater 200 and two (floor and top) heaters 300 and is preferably housed within a water-cooled, evacuated pressure container (not shown in detail in FIG. 3). An As partial pressure in the annealing furnace, which conventionally is usually applied in a quartz ampoule, is consequently neither possible nor required.

The described construction comprises no elements made of quartz, whereby any contamination of the wafer deriving from quartz is excluded.

Figure 4:
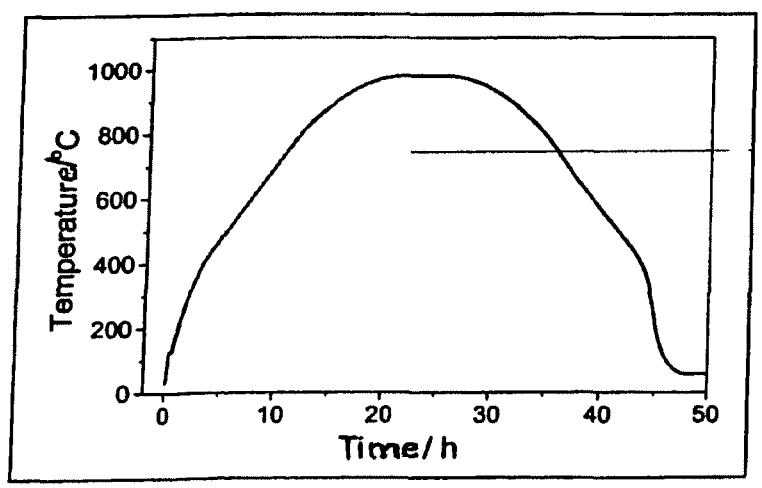
FIG. 4 is a graph showing an example of a temperature/time-profile for the one-step wafer annealing according to the invention.

The heat treatment of the wafer is preferably carried out under pure nitrogen or pure argon, which is respectively released from liquid gases, with an addition of ≤1 vol. % hydrogen. Before applying the pressurized gas, the pressure container is alternately evacuated to $10^{-3}$ mbar and washed with pure nitrogen. Thus, the procedurally expensive and cumbersome annealing under As partial pressure can be dispense with. Annealing takes place in a temperature range between 800° C. and 1050° C., and the total pressure of the process gas is 10-15 bar ($1 \times 10^6$ to $1.5 \times 10^6$ Pa). The annealing time depends on the desired extraction depth; and an example will be explained in further detail in Example 1 below. A characteristic temperature/time-profile is illustrated in FIG. 4. This profile reveals that the heating rate and the cooling rate are adjustable in a temperature dependent manner.

Further details of the invention can be gathered from the following examples.

EXAMPLE 1

A SI VGF GaAs crystal having a target diameter of 100 mm is grown by a VGF type process described in more detail by Th. Bünger, D. Behr, St. Eichler, T. Flade, W. Fliegel, M. Jurisch, A. Kleinwechter, U. Kretzer, Th. Steinegger, B. Weinert in *Mat. Sci. Technol. B*80 (2001), 5, and, after heat treatment, cropping, cylindrical grinding, flattening and sampling for the characterization of the initial status, the crystal is further processed to obtain wafers by in-hole-sawing to yield a standard thickness $d_0=(725\pm8)$ µm. The wafers are edge-ground, purity-etched, washed, dried and stored until use under a non-oxidizing atmosphere ($N_2$) by means of standard technology.

The charging of the wafers into the cassettes (diameter about 100 mm) of the invention is carried out in a laminar flow box. All cassettes of the device are filled with wafers (partially by dummy wafers). The free space above the wafer is 0.3 mm.

The stacked cassettes are completed to form an annealing assembly in the manner described above and are placed, in vertical direction, into an annealing furnace having 3 independently controllable heaters. The pressure vessel is 3 times alternately evacuated (respective final vacuum: $\leq 10^{-3}$ mbar) and subsequently filled with ultrapure nitrogen up to a pressure of 13 bar (at the respective annealing temperature). The final fill is carried out with ultrapure nitrogen, to which 1 vol. % $H_2$ is added. Annealing is carried out respectively at a nominal temperature of 950, 1000, 1050 and 1140° C. with a maintenance time of 5 h, respectively. The heating rate is 40 K/min up to 400° C., and above that the heating rate is linearly decreased over time up to the set temperature to a rate approaching 0 K/min when reaching the nominal temperature. Cooling to room temperature is carried out in a corresponding reverse manner.

By the addition of hydrogen, an oxide layer formation and thus an optionally possible inhibition of As desorption during heat treatment is diminished. Due to the fact that surface diffusion is increased by hydrogen, an aggregation of excess gallium to droplets is eliminated. The roughness of the wafer surface after annealing is significantly reduced in comparison with that of a sawed/etched surface.

The annealed wafers are subsequently processed according to standard technology, namely, by laser marking, damage etching and a double-sided preliminary polishing and a one-sided (at the front side) final polishing. Hereby, the thickness of the respectively removed surface-parallel layer is determined.

Figure 5:
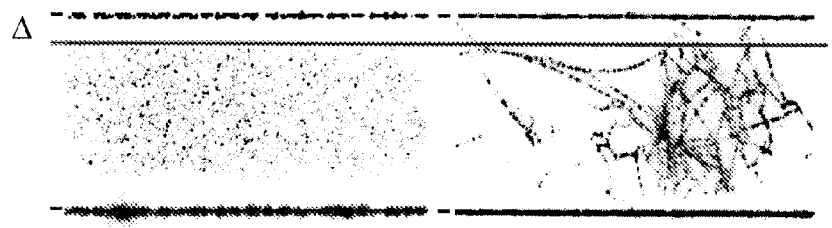
FIG. 5 is a sectional edge view showing a LST (Laser Scattering Tomography) mapping of an annealed wafer with respect to matrix precipitates (left illustration) and decoration precipitates (right illustration)

The size distribution of As precipitates after wafer annealing is examined, in the so-called edge view, by the known method of Laser Scattering Tomography (LST, cf. in this respect M. Naumann, J. Donecker, M. Neubert: "Laser scattering experiments in VCz GaAs," *J. Cryst. Growth* 210 (2000) 203). That is, a region close to the edge of the wafer surface is illuminated, and the scattered light emitted from the fracture edge is measured. In FIG. 5, examples for a wafer region are illustrated with respect to matrix precipitates (left) and decoration precipitates (right). The front side of the wafer faces to the top.

The wafer surfaces are indicated by broken lines. In a region Δ parallel to the surface, no matrix precipitates are detected. In a region corresponding to essentially the same thickness of the region Δ, the scatter intensity of the decoration precipitates is reduced significantly as well. It follows that the As deposits are dissolved together with As extraction by means of the heat treatment, or their size distribution is shifted to smaller dimensions. In correlation therewith, the number of COPs on the wafer surface is significantly reduced in comparison with the original status.

Figure 6:
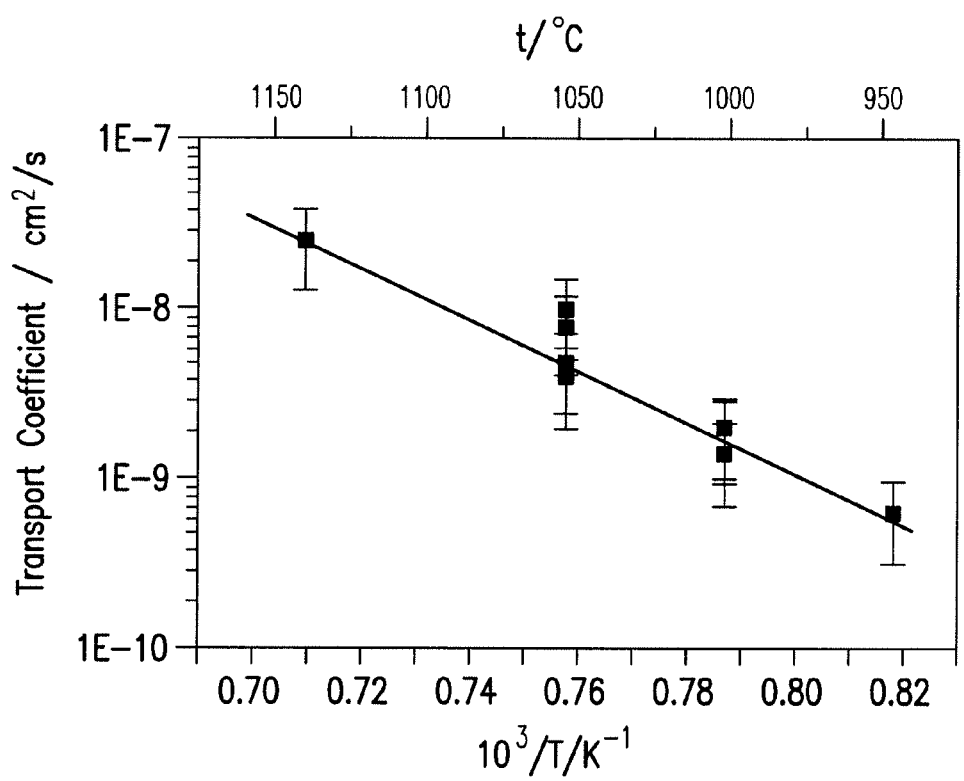
FIG. 6 is a graph showing the temperature dependency of the effective transport coefficient for the extractive wafer annealing.

A transport coefficient characterizing the As extraction is estimated from the well measurable depth Δ of the As deposit-free region. In FIG. 6, the transport coefficient is plotted against the reciprocal annealing temperature. The maintenance time required for obtaining the desired extraction depth at a prescribed temperature may be estimated thereby. See the above description with respect to an applicable calculation formula. For example, the required maintenance time is 4 h for a mean extraction depth of 70 μm at 980° C. The mean size of As precipitates rapidly increases to sizes typical for unannealed wafers at a distance from the wafer surface which is larger than the mean extraction depth.

With wedge-etched samples of annealed wafers it was determined that a layer that is close to the surface of the annealed wafer and that depends on the mean extraction depth having a decreased size of As deposits has p-type conductivity due to a decrease of the EL2 concentration. With a mean extraction depth of 70 μm, the thickness of the p type layer is about 20 μm. The thickness region further extending into the annealed wafer and still affected by As extraction remains semi-isolating (SI). The p type layer is reliably removed by damage etching and by advance polishing of the annealed wafer.

An evaluation of the structural perfection of the annealed wafers by means of dislocation etch pit density, residual strain level using birefringence measurements, and half width of {004} rocking curves determined by means of double crystal rocking curve mapping show no differences in comparison to the corresponding results with crystal annealed wafers.

EXAMPLE 2

Unannealed, cylindrically ground and notched SI VGF GaAs single crystals having a diameter of 152 mm are processed to wafers having a mean thickness of (774±8) μm by means of wire lapping. The wafers are purity-etched and damage-etched and are placed, as described in the first example, into the cassettes according to the invention, having an inner diameter of about 153 mm and providing a height of the free space above the wafers of 0.4 mm. The heat treatment is carried out at 980° C. with a maintenance time of 4 h. Heating and cooling rates are identical to the values mentioned in the first example. The operating pressure of $N_2/H_2$ process gases at the nominal temperature is 12 bar, and the hydrogen content is 1 vol. %.

The annealed wafers as well as the comparison wafers originating from the same crystals are edge-ground, laser-marked, damage-etched as well as double-sided pre-polished and one-sided final polished as well as finally purified. The final thickness of the wafer is (690±5) μm and therefore is at the upper tolerance limit for wafers having 150 mm diameter. Using standard procedures, subsequently the number of COPs is measured in the classified size range of (0.2-2.0) μm and (0.3-2.0) μm, through a determination of the so-called "light point defects" (lpd) by using Surfscan 6420 (KLA-Tencor). Also, the geometric parameters of the wafers are measured by using SUPERSORT™.

In Table 1, the mean number of COPs after wafer annealing is compared with that of the comparison wafers that are subjected conventionally to a crystal annealing. It is apparent that, by the wafer annealing, the number of COPs is decreased in the respective size ranges by more than one order of magnitude. Compared with the comparison material, the frequency distribution is narrower after wafer annealing according to the invention, indicating a very good reproduceability and reliability of the extraction process according to the invention for the control of As precipitates.

TABLE 1

"light point defects" (lpd) after crystal and wafer annealing

|  | lpd (0.2-2) μm number/cm² | lpd (0.3-2) μm number/cm² |
| --- | --- | --- |
| Crystal annealing | 80.4 ± 17.2 | 11.2 ± 8.4 |
| Wafer annealing | 3.3 ± 2.4 | 0.12 ± 0.08 |

The annealed wafers are pre-polished on both sides and final-polished on one side a second time and are again measured. The thickness is now in a range of the lower tolerance limit of (655±5) μm. The number of COPs on the wafer surface is higher than after the first polishing step, but still is lower than the specification limit. By choosing the extraction depth it is thus possible to decrease the number of COPs in the whole allowable thickness range of the wafer below the respective specification limits.

The results of the measurement of the geometric parameters of the wafers are shown in Table 2. There are not significant differences. Thus, the annealing in the cassettes of the invention does not lead to a deterioration of the geometric parameters of the wafers in comparison with the conventional procedure.

TABLE 2

Geometric parameters after crystal and wafer annealing

|  | ttv/μm | ltv/μm | sori/μm | warp/μm | bow/μm |
| --- | --- | --- | --- | --- | --- |
| Crystal annealing | 1.27 ± 0.46 | 0.74 ± 0.27 | 2.38 ± 1.48 | 2.55 ± 1.61 | 0.24 ± 0.53 |
| Wafer annealing | 2.06 ± 1.15 | 1.21 ± 0.66 | 2.90 ± 1.84 | 3.10 ± 2.59 | 1.01 ± 1.44 |

For evaluating the homogeneity of properties that are relevant for device elements, the $EL2^0$ concentration of the annealed wafers is illustratively measured at a sector having a width of 7.5 mm along a wafer radius (0-$R_W$) in <110> direction, at a lateral resolution of about 30 μm across and 270 μm parallel to the sector. The measurements are carried out by the known method of absorption in the near infrared at λ=1064 nm, using the photo ionization cross sections of Silverberg et al. (P. Silverberg, P. Omeling, L. Samuelson: *Appl. Phys. Lett.* 52(1988)1689). Furthermore, whole wafer mappings of the electrical resistivity with a resolution of 1.0 mm are measured by the TDCM method according to R. Stibal et al. (R. Stibal, J. Windscheif, W. Jantz: "Contactless evaluation of semi-insulating GaAs wafer resistivity using the time dependent charge measurement," *Semicond. Sci. Technol.* 6 (1991)995-1001).

The mean $EL2^0$ concentration of the wafers is increased by the wafer annealing according to the invention by about 30% up to $1.40 \times 10^{16}$ cm$^{-3}$ in comparison to wafers originating from crystals after the standard crystal annealing. As becomes apparent from Table 3, the relative standard deviation of the mean EL2° concentration is decreased from 12-16% to 4-5% after wafer annealing. The mesoscopic homogeneity of the EL2° distribution (see: M. Wickert: "Physikalische Mechanismen der Homogenisierung elektrischer Eigenschaften von GaAs-Substraten" ("Physical Mechanisms of the Homogenization of Electric Properties of GaAs Substrates"), PhD Thesis, Albert-Ludwigs-Universität Freiburg im Breisgau, 1998), which is about 9% after crystal annealing, improves to about 4% by means of the wafer annealing. Corresponding to the increase of the EL2° concentration, the mean resistivity of the wafer decreases. Analogous to an improved EL2° homogeneity, the annealed wafers are improved in the macroscopic and mesoscopic homogeneity of the resistance.

TABLE 3

EL2° distribution after crystal and wafer annealing

|  | RSTD/% | $\sigma_{mesos}$/% |
|---|---|---|
| Crystal annealing | 12.3 ± 8.7 | 9.0 ± 2.4 |
| Wafer annealing | 4.2 ± 0.8 | 3.8 ± 0.6 |

For evaluating the structural perfection of the annealed wafers, the dislocation etch pit density is determined according to the standard KOH etching and by determining the whole wafer mappings, and the mean half width value of the {004}-Cu—K$_\alpha$ double crystal rocking curve mappings with <110> rocking axis and 1×1 mm$^2$ step width as well as 1×2 mm measurement spot size is determined. The results of these evaluations are contained in Table 4.

TABLE 4

EPD and rocking curve half width value

|  | epd/cm$^2$ | FWHM$_{mean}$/arcsec |
|---|---|---|
| Crystal annealing | 6840 ± 1250 | 10.41 ± 0.88 |
| Wafer annealing | 5600 ± 1020 | 10.83 ± 0.20 |

No significant differences with respect to the corresponding results of crystal annealed wafers are found, i.e., the structural perfection of the annealed wafers is not altered by the heat treatment according to the invention in the annealing device of the invention.

EXAMPLE 3

Three unannealed and three crystal annealed SI VGF GaAs single crystals, each having a target diameter of 150 mm, are processed, after cropping and cylindrical grinding, to wafers having a mean thickness of (770±8) μm by means of wire lapping. The wafers are purification-etched and damage-etched, and, as described in the first example, are placed into the cassettes of the invention having an inner diameter of about 153 mm and a free space height of 0.4 mm. The heat treatment is carried out at 980° C. for a maintenance time of 4 h. Heating and cooling rates are identical to those mentioned in the first example. The operation pressure of the N$_2$/H$_2$ process gases at the nominal temperature was 11-13 bar, the hydrogen content was 1 vol. %.

The annealed wafers are edge-ground, laser-marked, damage-etched as well as double-sided pre- and one-sided final-polished as well as final-polished according to standard procedures. A part of the wafers is double sided pre- and one-sided final-polished for a second time.

With these wafers, the fracture strength is measured after determining the number of COPs. The measurements are carried out by using a modified double ring test, as described in more detail by SCHAPER et al. (M. Schaper, M. Jurisch, H.-J. Klauβ, H. Balke, F. Bergner, R. Hammer, M. Winkler: "Fracture Strength of GaAs Wafers," in B. Michel, T. Winkler, M. Werner, H. Fecht (Eds.): *Proceedings* 3*rd Internat. Conf. MicroMat* 2000, Apr. 17-19, 2000, Berlin). The support ring having an inner diameter of 142 mm is made of PTFE, and the load is applied to the center of the wafer by a stainless steel ball with ⅛" in diameter. The final polished front sides of the wafers are respectively loaded in tension. The load/bending-curves are recorded until fracture. The examination result consists of the pair of the values fracture load/maximal bending ($F_{max}$, f). The measurement results are standardized to a uniform wafer thickness of 675 μm. This standardization, as well as the calculation of the fracture strength based on the fracture load, are carried out on the basis of the theoretical analysis of the fracture tests by F. DUDERSTADT (F. Duderstadt: "Anwendung der von Karman'schen Plattentheorie und der Hertz'schen Pressung für die Spannungsanalyse zur Biegung von GaAs-Wafern im modifizierten Doppelringtest" ("Application of the Karman Plate Theory and Hertz Pressing for Tension analysis of the Bending of GaAs Wafers in the Modified Double Ring Test"), PhD thesis, TU Berlin, 2003).

The characteristic fracture strength of the wafers after wafer annealing in comparison with the corresponding results with wafers of crystal annealed SI VGF GaAs single crystals are represented in Table 5.

TABLE 5

Fracture strength of the wafers after crystal and wafer annealing

|  | $\sigma_C$/MPa |
|---|---|
| Crystal annealing | 1475 ± 155 |
| Wafer annealing | 2060 ± 150 |

The characteristic fracture strength of the annealed wafers is significantly higher than that of crystal annealed wafers. The reason for this difference is considered to be based on a decreased mean size of As precipitates, obtained by the wafer annealing in the surface near regions, and the lower mean size of the COPs on the wafer surface resulting therefrom compared to the crystal annealed material. Apparently, the COPs act as nuclei for initiating the fracture process.

Comparison Wafers

The wafers taken for comparison are made of SI VGF GaAs single crystals after crystal annealing. The annealing is carried out in quartz ampoules under an As partial pressure of 1 bar at 800° C. with a holding time of 10 h. The heating and cooling rates are 0.5 K/min above 400° C.

The foregoing description of preferred embodiments of the invention has been presented for purposes of illustration and description only. It is not intended to be exhaustive or to limit the invention to the precise form disclosed, and modifications and variations are possible and/or would be apparent in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto and that the claims encompass all embodiments of the invention, including the disclosed embodiments and their equivalents.

What is claimed is:

1. A GaAs semiconductor single crystal wafer having a diameter of ≥100 mm and a dislocation density of about ≤1×10⁴ cm⁻²,
   wherein said GaAs semiconductor single crystal wafer is semi-insulating (SI) and has a mean EL2 concentration of at least 1.4×10¹⁶ cm⁻³,
   wherein the surface of said GaAs semiconductor single crystal wafer has a number of light point defects (lpd), measured in an lpd size range of 0.3-2.0 μm, of smaller than about 0.3 cm⁻²,
   wherein said GaAs semiconductor single crystal wafer is derived from Vertical Gradient Freeze (VGF)- or Vertical Bridgman (VB)-produced GaAs single crystal, and
   wherein a characteristic fracture strength, at which the wafer has a probability of failure of about 63.2% (Weibull characteristic strength σ of test piece), is higher than about 1900 MPa.

2. A GaAs semiconductor single crystal wafer according to claim 1, being further defined by at least one of the following features:
   a concentration of total impurities other than carbon and boron of about ≤5×10¹⁴ cm⁻³, and $|\Delta[EL2^0]/[EL2^0]| \leq 7.5\%$ and $\sigma_{mesos} \leq 6\%$.

3. A GaAs semiconductor single crystal wafer according to claim 1, produced by a process for heat treating, at an increased temperature, a wafer comprising, at least at a surface thereof, a III-V semiconductor material, the wafer having a diameter of ≥100 mm, wherein the process comprises:
   placing one or more wafers having a diameter of ≥100 mm in an interior space of a heating furnace or container;
   heating the wafer at an increased temperature, under a condition wherein a limited gas exchange is ensured between the surface of the wafer to be heat treated and the interior space c the heating furnace or container, such that precipitates of the V component are substantially reduced in size and/or density in a surface layer of the III-V semiconductor material-comprising surface of the wafer.

4. A GaAs semiconductor single crystal wafer according to claim 1, produced by a process for heat treating at an increased temperature a wafer comprising, at least at a surface thereof, a GaAs semiconductor material, wherein the process comprises:
   providing a wafer comprising, at least at a surface thereof, the GaAs semiconductor material, the wafer having a diameter of ≥100 mm,
   heating the wafer at an increased temperature, under a condition that extracts As from a region of the GaAs-comprising surface, thereby substantially reducing density and/or size of As-precipitates in the surface region, the surface region being at least about 5 μm or more in thickness.

5. A GaAs semiconductor single crystal wafer according to claim 1, produced by a process for heat treating at an increased temperature a wafer comprising a III-V semiconductor material and having a diameter of ≥100 mm, comprising:
   after a step for purifying and etching, and before a step for edge-grinding, heating the wafer at an increased temperature in a heat treatment device that is free of quartz and that comprises at least one wafer support unit.

* * * * *